United States Patent [19]
Chen et al.

[11] Patent Number: 6,128,039
[45] Date of Patent: Oct. 3, 2000

[54] COLUMN AMPLIFIER FOR HIGH FIXED PATTERN NOISE REDUCTION

[75] Inventors: Datong Chen, Fremont; Xinping He, San Jose, both of Calif.

[73] Assignee: OmniVision Technologies, Inc., Sunnyvale, Calif.

[21] Appl. No.: 09/228,248

[22] Filed: Jan. 11, 1999

[51] Int. Cl.$^7$ .................................................. H04N 3/14
[52] U.S. Cl. ..................... 348/294; 348/301; 250/208.1
[58] Field of Search ............... 250/208.01, 332, 250/339.02, 370.08; 330/59, 110, 308; 348/294, 300, 301, 308, 303, 310, 315; 327/93

[56] References Cited

U.S. PATENT DOCUMENTS

| | | | |
|---|---|---|---|
| 4,317,134 | 2/1982 | Woo et al. ............................. | 358/213 |
| 4,803,709 | 2/1989 | Kimata ................................... | 257/239 |
| 4,843,473 | 6/1989 | Bencuya et al. ...................... | 348/306 |
| 5,101,108 | 3/1992 | Gaalema et al. ..................... | 250/332 |
| 5,162,670 | 11/1992 | Itakura et al. ......................... | 327/93 |
| 5,317,407 | 5/1994 | Michon ................................. | 348/306 |
| 5,371,470 | 12/1994 | Jeng ...................................... | 327/552 |
| 5,446,283 | 8/1995 | Dautriche .............................. | 250/332 |
| 5,471,515 | 11/1995 | Fossum et al. ....................... | 257/239 |
| 5,589,847 | 12/1996 | Lewis .................................... | 345/98 |
| 5,614,740 | 3/1997 | Gardner et al. ....................... | 257/222 |
| 5,731,578 | 3/1998 | Mizuno ............................. | 250/208.1 |
| 5,909,026 | 6/1999 | Zhou et al. ....................... | 250/208.1 |
| 5,925,883 | 7/1999 | Woolaway, II ........................ | 250/332 |
| 5,949,483 | 9/1999 | Fossum et al. ................... | 250/208.1 |

OTHER PUBLICATIONS

Fossum, Eric R., "Active Pixel Sensors: Are CCD's Dinosaurs?", *SPIE*, 1900:2–14.

Mendis, Sunetra K. et al., "Progress in CMOS Active Pixel Image Sensors," *SPIE*, 2172:19–29.

*Primary Examiner*—Trong Q. Phan
*Attorney, Agent, or Firm*—Blakely, Sokoloff, Taylor & Zafman, LLP

[57] ABSTRACT

A column amplifier for high fixed pattern noise reduction. The column amplifier includes a switching capacitor amplifier, a sample and hold stage, and an output buffer. The switching capacitor amplifier receives signals from a bit line that is coupled to a column of active pixel sensors. The switching capacitor amplifier is capacitively coupled to the bit line from a column of active pixel sensors and is able to cancel the common mode offset in the bit line. The common mode can also be adjusted in the switching capacitor amplifier, such that the last stage of the column amplifier (e.g., the buffer stage) is not limited by the common mode level of the active pixel sensors. The switching capacitor amplifier includes an input capacitor and a feedback capacitor. The gain of the switching capacitor amplifier amplifies the pixel signals so that the fixed pattern noise introduced by stages after the switching capacitor amplifier will comprise a lower proportion of the total signal.

16 Claims, 6 Drawing Sheets

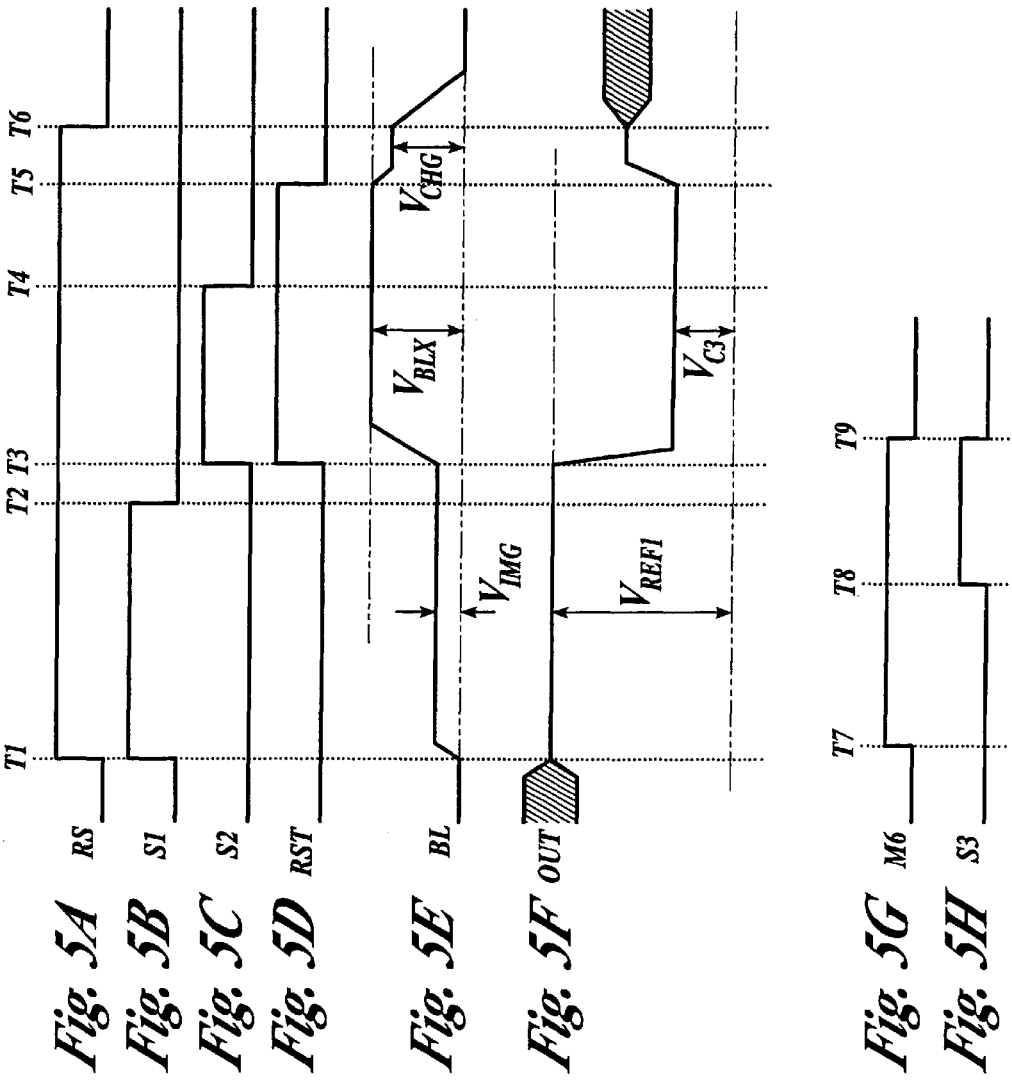

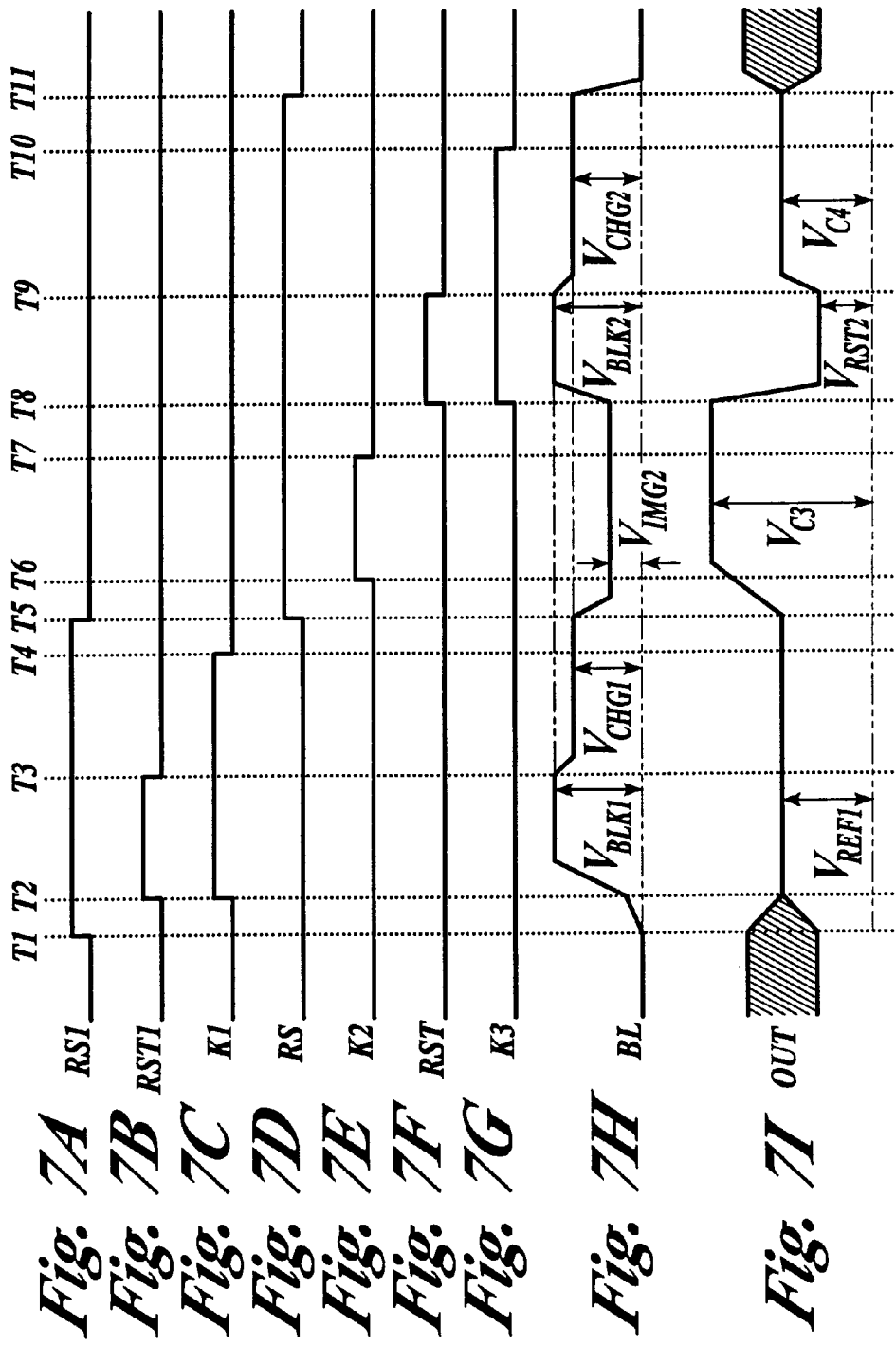

COLUMN AMPLIFIER FOR HIGH FIXED PATTERN NOISE REDUCTION

FIELD OF THE INVENTION

The present invention relates to metal oxide semiconductor (MOS) image sensors and, more particularly, a column amplifier that removes fixed pattern noise.

BACKGROUND OF THE INVENTION

Integrated circuit technology has revolutionized various fields including computers, control systems, telecommunications, and imaging. One field in which integrated circuitry is widely used is in video imaging. Different types of semiconductor imagers include: charge coupled devices, photodiode arrays, charge injection devices, and hybrid focal plane arrays. Many of these devices include pixels that are arranged in sensor arrays to convert light signals into electrical signals.

It is desirable in image sensors to remove KTC noise and fixed pattern noise (FPN) from the signals that originate at the pixels and pass through the image sensor circuitry. Fixed pattern noise that is produced in CMOS image sensors is related to the fact that there are typically different readout circuits for each pixel and also different column amplifiers for each column of a CMOS image sensor pixel array. The readout circuits each generate pixel fixed pattern noise and the column amplifiers each generate column fixed pattern noise due to circuit and process variations. KTC noise is produced during the switching of signals by switches.

One prior art circuit for reducing KTC noise and fixed pattern noise is shown in "Progress in CMOS Active Pixel Sensors," by S. K. Mendis et al., *Proceedings of the SPIE—The International Society for Optical Engineering,* Volume 2172, 1994, pages 19–29. The circuit shown in the Mendis et al. reference is patented in U.S. Pat. No. 5,471,515 to Fossum et al. FIG. 3 of the Fossum et al. patent is reproduced herein as FIG. 1.

FIG. 1 is a simplified schematic diagram of one pixel cell of a focal plane array of many such cells formed in an integrated circuit. Referring to FIG. 1, a photogate consists of a relatively large photogate electrode 30 overlying a substrate 20. A charge transfer section consists of a transfer gate electrode 35 adjacent to the photogate electrode 30, a floating diffusion 40, a reset electrode 45, and a drain diffusion 50. A readout circuit consists of a source follower field effect transistor (FET) 55, a row select FET 60, a load FET 65, and a correlated double sampling circuit 70. A bit line BL couples the top of the load FET 65 to the sampling circuit 70. The bit line BL is the line to which all of the pixels of a column are connected and onto which the pixel signals from each pixel in a column are read.

The readout circuit 70 consists of a signal sample and hold (S/H) circuit including an S/H FET 200 and a signal store capacitor 205 connected through the S/H FET 200 and through the row select FET 60 to the source of the source follower FET 55. The other side of the capacitor 205 is connected to a source bias voltage VSS. The one side of the capacitor 205 is also connected to the gate of an output FET 210. The drain of the output FET 210 is connected through a column select FET 220 to a signal sample output node VOUTS and through a load FET 215 to the drain voltage VDD. The output FET 210, the column select FET 220, and the load FET 215 essentially comprise an output buffer stage of the readout circuit 70. A signal called "signal sample and hold" (SHS) briefly turns on the S/H FET 200 after the charge accumulated beneath the photogate electrode 30 has been transferred to the floating diffusion 40, so that the capacitor 205 stores the source voltage of the source follower FET 55 indicating the amount of charge previously accumulated beneath the photogate electrode 30.

The readout circuit 70 also consists of a reset sample and hold (S/H) circuit including an S/H FET 225 and a signal store capacitor 230 connected through the S/H FET 225 and through the row select FET 60 to the source of the source follower FET 55. The other side of the capacitor 230 is connected to the source bias voltage VSS. The one side of the capacitor 230 is also connected to the gate of an output FET 240. The drain of the output FET 210 is connected through a column select FET 245 to a reset sample output node VOUTR and through a load FET 235 to the drain voltage VDD. The output FET 240, the column select FET 245, and the load FET 235 essentially comprise another output buffer stage of the readout circuit 70. A signal called "reset sample and hold" (SHR) briefly turns on the S/H FET 225 immediately after the reset signal RST has caused the resetting of the potential of the floating diffusion 40, so that the capacitor 230 stores the voltage to which the floating diffusion has been reset.

The readout circuit provides correlated double sampling of the potential of the floating diffusion, in that the charge integrated beneath the photogate 30 each integration period is obtained at the end of each integration period from the difference between the voltages at the output nodes VOUTS and VOUTR of the readout circuit 70. This helps eliminate the effects of fixed pattern noise caused by variations in FETs M55, M60, M45, and M65. In other words, the difference between VOUTS and VOUTR cancels the fixed pattern noise.

The feature of the circuit of FIG. 1 that is useful for eliminating fixed pattern noise due to variations in FET threshold voltage across the substrate 20 is a shorting FET 116 across the sampling capacitors 205 and 230. After the accumulated charge has been measured as the potential difference between the two output nodes VOUTS and VOUTR, a shorting signal VM is temporarily applied to the gate of the shorting FET 116 and the VOUTS-to-VOUTR difference is measured again. This latter difference is a measure of the disparity between the threshold voltages of the output FETs 210 and 240, and may be referred to as the fixed pattern difference. The fixed pattern difference is subtracted from the difference between VOUTS and VOUTR measured at the end of the integration period, to remove fixed pattern noise.

One of the drawbacks of the circuit illustrated in FIG. 1 is that the bit line BL onto which the pixel signals are read has a common mode offset. This common mode offset can make it difficult to reduce the fixed pattern noise once the signal reaches the output buffer stages represented by FETs 210, 215, 220 and FETs 235, 240, 245, respectively, in that the charge injection may be different for different signal levels, and the output buffer stage may have certain nonlinearities. In the prior art circuit of FIG. 1, the buffer stage is limited by the common mode level of the active pixel sensors. In addition, the buffer stage itself, or later stages, may introduce fixed pattern noise of an undesirable proportion of the total signal level.

The present invention is directed to overcoming the foregoing and other disadvantages. More specifically, the present invention is directed to providing a column amplifier for high fixed pattern noise reduction.

SUMMARY OF THE INVENTION

A column amplifier for high fixed pattern noise reduction is provided. The basic column amplifier includes a switching capacitor amplifier, a sample and hold stage, and an output buffer. The output buffer amplifier can be a source follower or operational amplifier.

In accordance with one aspect of the invention, the switching capacitor amplifier is capacitively coupled to the bit line. The switching capacitor amplifier is able to cancel the common mode offset in the bit line. This improves the fixed pattern noise reduction which would otherwise be difficult to achieve given that the charge injection from the pixels is different at different signal levels and given that there may be certain nonlinearities in the following buffer or other stages.

In accordance with another aspect of the invention, the common mode can be adjusted in the switching capacitor amplifier. This means that the last stage (e.g., the buffer stage) is not limited by the common mode level of the active pixel sensors.

In accordance with yet another aspect of the invention, the switching capacitor amplifier has an input capacitor and a feedback capacitor. The gain of the switching capacitor amplifier is represented by the ratio of the size of the input capacitor over the size of the feedback capacitor. The gain of the switching capacitor amplifier amplifies the pixel signals so that the fixed pattern noise introduced by stages after the switching capacitor amplifier will comprise a lower proportion of the total signal. Thus, the proportional fixed pattern noise introduced by stages after the switching capacitor amplifier is effectively reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A and 5B are timing diagrams illustrating the operation of the column amplifier of FIG. 2;

FIG. 7 is a timing diagram illustrating the operation of the column amplifier of FIG. 6.

DETAILED DESCRIPTION OF THE PREFERRED EMBODIMENT

Figure 1:
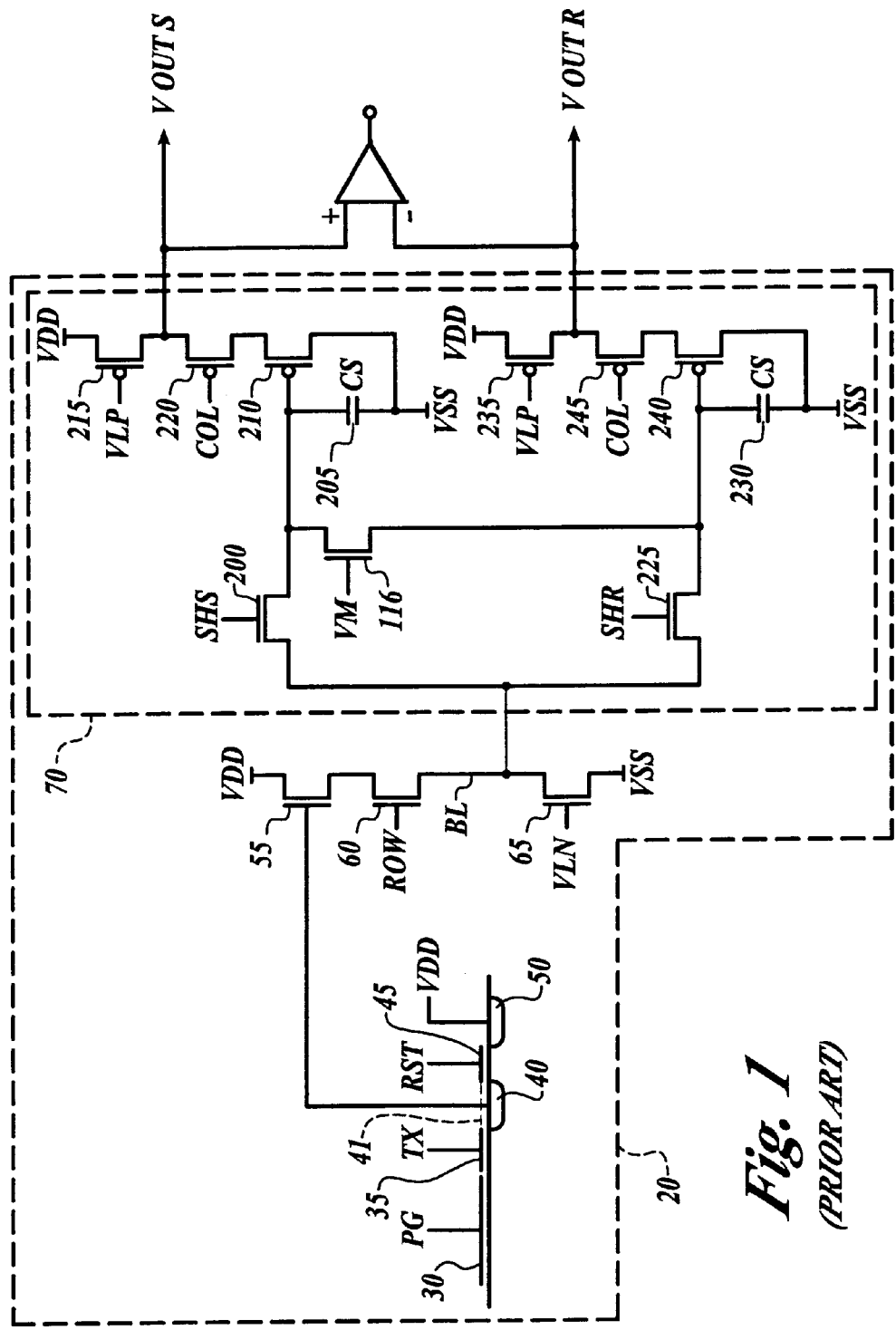
FIG. 1 is a schematic diagram of a prior art CMOS active pixel sensor array.
Figure 2:
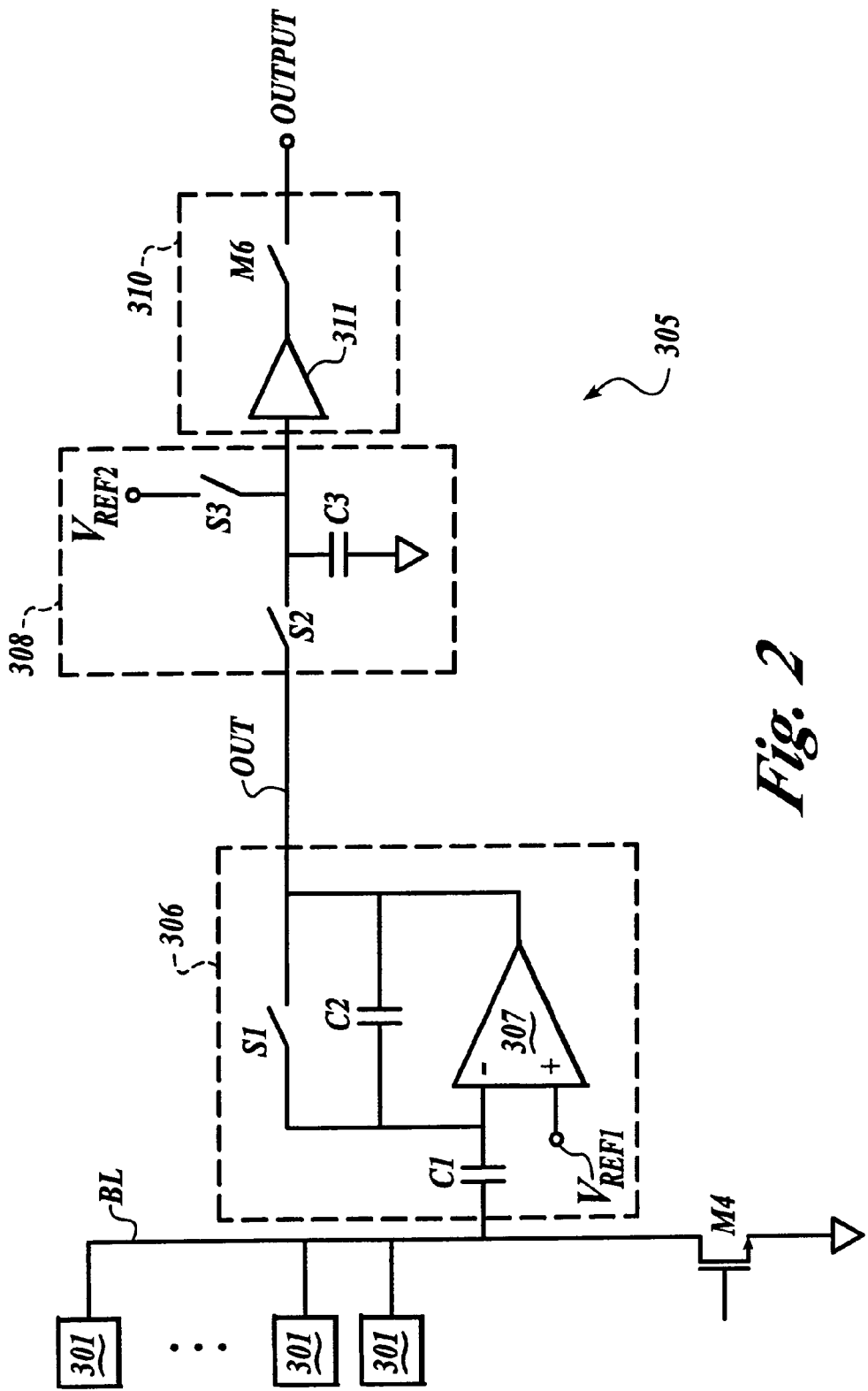
FIG. 2 is a schematic diagram of a column amplifier formed in accordance with the present invention.

With reference to FIG. 2, a column amplifier 305 formed in accordance with the present invention is shown. Providing the input to the column amplifier 305 is a column of active pixel cells (APC) 301. The signals from the active pixel cells 301 are provided to the column amplifier 305 through a bit line BL. The APC 301 is one type of pixel that can be used in an imaging sensor. The column amplifier 305 consists of a switching capacitor amplifier 306, a sample and hold stage 308, and an output buffer stage 310. The output buffer amplifier can be a source follower or an operational amplifier.

Specifically, each column amplifier 305 of the present invention includes a sense capacitor C1, an operational amplifier 307, a feedback capacitor C2, an output capacitor C3, an output buffer 311, and switches S1, S2, S3, and M6. In the preferred embodiment, the capacitors are formed as part of the MOS device. As described below, switches S1–S3 and M6 control the routing of the input signal from an APC 301 through the column amplifier 305.

The sense capacitor C1 is connected between the bit line BL and the inverting input of the operational amplifier 307. The bit line BL is also coupled to ground through a transistor M4. The noninverting input of the operational amplifier 307 is connected to a reference voltage $V_{ref1}$. The output of the operational amplifier 307 is fed back into the inverting input of the operational amplifier 307 through a feedback capacitor C2. Switch S1 is coupled between the output of the operational amplifier 307 and the inverting input of the operational amplifier 307.

The output of the operational amplifier 307 is provided via a switch S2 to an input terminal of output capacitor C3. The other terminal of the output capacitor C3 is connected to ground. Also connected to the input terminal of the output capacitor C3 is a switch S3 that leads to a second voltage reference $V_{ref2}$. Also connected to the input terminal of the output capacitor C3 is the input terminal to the output buffer 311. Finally, a switch M6 is located between the output of the output buffer 311 and final output of the column amplifier 305.

Figure 3:
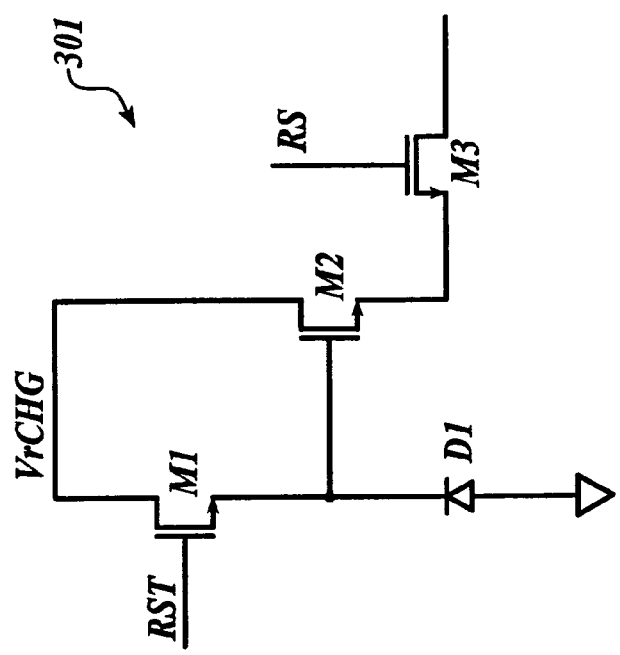
FIG. 3 is a schematic diagram of an actual embodiment of an active pixel cell of FIG. 2.

FIG. 3 illustrates an actual embodiment of one of the active pixel cells 301 of FIG. 2. One example of the physical layout of an active pixel cell can be seen in "Active Pixel Sensors: Are CCD's Dinosaurs?," by E. R. Fossum, *Proceedings of the SPIE: Charge-coupled Devices and Solid State Optical Sensors III*, Volume 1900, 1993, pages 2–14. The active pixel cell 301 is illustrated in FIG. 3 as including three transistors M1, M2, and M3 and a diode D1. Transistors M1, M2, and M3 may be n-channel MOSFETs. As illustrated in FIG. 3, the anode of diode D1 is coupled to ground, while the cathode of diode D1 is coupled to the source of transistor M1 and to the gate of transistor M2. The gate of transistor M1 receives a control signal RST. The drain of transistor M1 is coupled to a signal voltage VrCHG. The drain of transistor M2 is also coupled to the signal voltage VrCHG, while the source of transistor M2 is coupled to the source of transistor M3. The gate of transistor M3 receives a control signal RS, and the drain of transistor M3 is the output of the active pixel cell 301.

Figure 4:
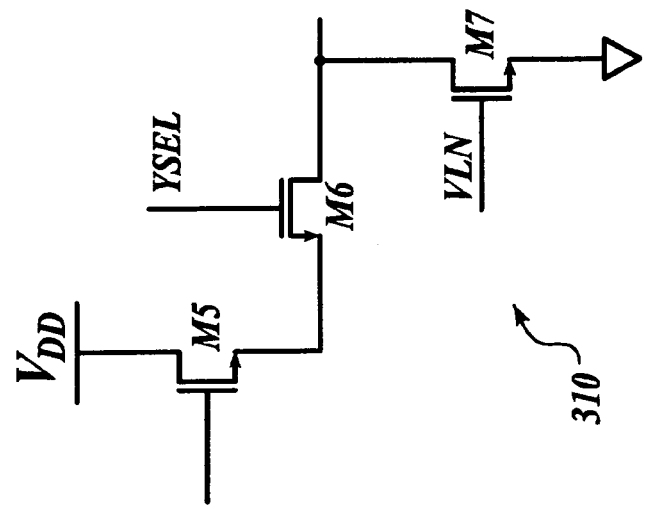
FIG. 4 is a schematic diagram of an actual embodiment of an output buffer of FIG. 2.

FIG. 4 illustrates an actual embodiment of the output buffer 310 of FIG. 2. As illustrated in FIG. 4, the output buffer 310 includes three transistors M5, M6, and M7. The transistor M6 acts as the switch M6 in FIG. 2. The transistors M5, M6, and M7 may be n-channel MOSFETs. The drain of the transistor M5 is coupled to the power supply $V_{DD}$ of the circuit, while the gate of the transistor M5 is the input of the output buffer 310. The source of the transistor M5 is coupled to the source of the transistor M6. The gate of the transistor M6 receives a control signal Y-SEL, while the drain of the transistor M6 is the output of the output buffer 310. The source of the transistor M7 is coupled to ground, while the drain of transistor M7 is coupled to the output of the output buffer 310. The gate of the transistor M7 receives a biasing voltage VLN.

FIG. 5A is a series of timing diagrams illustrating the operation of the switching capacitor amplifier 306 of FIG. 2. Timing diagrams are shown illustrating the operation of control signals for switches S1 and S2, control signals RS and RST, and the input signal from bit line BL and output signal OUT for the switching capacitor amplifier 306.

As illustrated prior to time t1, all of the control signals and the bit line BL signal are low, while the output signal OUT is unknown and in a "don't care" state. At time t1, the control signal RS transitions high. As illustrated in FIG. 3, the control signal RS controls the output of the active pixel cell 301. The transitioning of control signal RS at time t1 causes transistor M3 (FIG. 3) to turn on. The turning on of transistor M3 allows the charge accumulated in the active pixel cell 301 to be transferred as an image signal level $V_{IMG}$ to the bit line BL, which is coupled to the input of switching capacitor amplifier 306. Also occurring at time t1, the control signal for switch S1 transitions high, thus causing switch S1 to close. The closing of switch S1 causes the output signal OUT of the switching capacitor amplifier 306 to approach the reference voltage $V_{ref1}$. The closing of switch S1 also allows the image signal level $V_{IMG}$ to be stored on the input capacitor C1.

At time t2, the control signal for switch S1 transitions low, thus causing switch S1 to open. The image signal level $V_{IMG}$ remains stored on the input capacitor C1. The opening of switch S1 introduces some KTC-type noise into the signal which cannot be canceled.

At time t3, the control signal RST transitions high, thus resetting the charge accumulated in the active pixel cell 301. As illustrated in FIG. 3, the control signal RST controls transistor M1 of the active pixel cell 301. Thus, when the control signal RST goes high, the transistor M1 turns on, thus resetting the accumulated charge. The output of the active pixel cell 301, and thus the bit line BL and the input to the switching amplifier 306, transition to a black signal level $V_{BLK}$. The difference between the black signal level $V_{BLK}$ and the image signal level $V_{IMG}$ is amplified by the switching capacitor amplifier 306. The gain of the switching capacitor amplifier 306 is determined by the ratio of the capacitors C1/C2. Also occurring at time t3, the control signal for switch S2 transitions high, thus causing switch S2 to close and store the amplified differential between the signal levels $V_{IMG}$ and $V_{BLK}$ on capacitor C3 as the signal level $V_{C3}$.

By amplifying the difference between the black signal level $V_{BLK}$ and the image signal level $V_{IMG}$, the switching capacitor amplifier 306 provides correlated double sampling of the potential of the active pixel cell 301, thus eliminating fixed pattern noise. The fixed pattern noise is due to variation in the transistor FET threshold voltages, variation in the transistor FET geometry size of the transistors in the active pixel cell 301, and the variation in the transistor FET M4. The fixed pattern noise caused by these mismatches are included in both the black signal level $V_{BLK}$ and the image signal level $V_{IMG}$. Thus by taking the differential between the two signal levels, the fixed pattern noise caused by the mismatches is canceled.

At time t4, the control signal for switch S2 transitions low, thus opening switch S2, while the amplified differential signal level $V_{C3}$ remains stored on capacitor C3. The opening of switch S2 introduces some KTC-type noise into the signal which cannot be canceled.

At time t5, the control signal RST transitions low, thus ending the reset period of the active pixel cell 301. The charge injection in the active pixel cell 301 causes the potential in the sensor to drop. The drop of potential in the sensor causes the voltage drop on the bit line BL to the signal level $V_{CHG}$. This voltage drop also causes a corresponding increase in the output signal OUT of the switching capacitor amplifier 306. However, since switch S2 is open at this time, the change in the output signal OUT of the switching capacitor amplifier 306 does not affect the stored signal level $V_{C3}$ on the capacitor C3. The transitioning of the control signal RST to low, which opens transistor M1, introduces another KTC-type noise signal, but this KTC noise signal is also not stored on capacitor C3 because the switch S2 is open when the RST signal transitions low. As will be discussed in more detail below, the timing of switch S2 relative to the reset signal RST can control some of the types of noise that are stored or eliminated. It should be noted that when the active pixel cell 301 begins integrating, the reset signal RST will again need to transition, thus introducing another element of KTC-type noise along with the charge injection.

At time t6, the control signal RS transitions low, thus causing the transistor M3 to open. The input of amplifier 307 is thus pulled to ground, since there is no current in the bit line BL. The output signal OUT of the switching capacitor amplifier 306 enters a "don't care" state and becomes unknown after time t6.

The timing diagrams described above are designed in part to eliminate certain types of noise from the image signal. For example, as described above, at time t4, switch S2 is transitioned low, while at time t5, the reset control signal RST is transitioned low. As will be described in more detail below, this timing is intended to focus on eliminating KTC noise rather than eliminating fixed pattern noise that is introduced by charge injection.

As described previously, KTC-type noise is produced during the switching of signals by switches, and is somewhat random and therefore difficult to cancel since a first KTC-type noise signal does not necessarily follow the same pattern as a second KTC-type noise signal. Because first and second KTC-type noise signals do not necessarily follow a set pattern, a technique of subtracting the second signal from the first signal does not work to cancel the KTC-type noise. In contrast, fixed pattern noise is somewhat more predictable, thus allowing a first fixed pattern noise signal to be subtracted from a second fixed pattern noise signal, so as to cancel the two fixed pattern noise signals.

With reference to the active pixel cell 301 of FIG. 3, charge injection produced by the transitioning of the reset signal RST can cause pixel level fixed pattern noise. More specifically, the pixel level fixed pattern noise is produced due to a mismatch of geometry size and threshold voltages of transistors M1 and M2, and the capacitance of diode D1. Thus, at time t4, the signal on bit line BL includes a certain amount of pixel level fixed pattern noise introduced by the initial charge injection of the active pixel cell 301. At time t4, when switch S2 of FIG. 2 is opened, the pixel level fixed pattern noise is included with the signal level that is stored on capacitor C3.

One way to have eliminated the pixel level fixed pattern noise from the signal stored on capacitor C3 would have been to have transitioned switch S2 after the transitioning of reset signal RST. In other words, when reset signal RST transitions low, it produces a complementary pixel level fixed pattern noise signal due to charge injection that would have been able to essentially cancel the initial pixel level fixed pattern noise. However, because the switch S2 was already opened at time t4, when the reset signal RST transitions low at time t5, the complementary pixel level fixed pattern noise signal is not subtracted from the signal that is stored on capacitor C3.

The previous description raises the issue of why the control signal for switch S2 and the reset signal RST are transitioned in the order shown in FIG. 5A, rather than in the reverse order that would have eliminated the pixel level fixed pattern noise, as described above. The reason switch S2 is transitioned first and reset signal RST is transitioned second is to prevent an additional type of KTC noise from being introduced into the image signal. In other words, while the transitioning of the reset signal RST produces a complementary pixel level fixed pattern noise signal, it also produces an additional KTC noise signal. Thus, by transitioning the signals in the order shown, the additional KTC noise-type signal that is produced at time t5 by the transitioning of reset signal RST is not included in the signal that is stored on capacitor C3. Thus, the timing of the signals as shown is focused on eliminating the additional KTC-type noise signal, rather than canceling the pixel level fixed pattern noise described above. In contrast, a timing diagram scheme in which reset signal RST was transitioned low first and the control signal for switch S2 was transitioned low afterwards would instead be focused on canceling the pixel level fixed pattern noise from the image signal, rather than eliminating the KTC-type noise introduced by the transitioning of reset signal RST.

In other words, as described above, the image signal level $V_{IMG}$ includes pixel level fixed pattern noise caused by charge injection. In contrast, the black signal level $V_{BLK}$ includes neither a complementary amount of pixel level fixed pattern noise nor an additional level of KTC noise caused by the transitioning of the reset signal RST. By way of comparison, if the reset signal RST had been transitioned low before the control signal for switch S2, the black signal level $V_{BLK}$ would have included both the pixel level fixed pattern noise and the additional KTC noise. In such a case, the pixel level fixed pattern noise included in the image signal level $V_{IMG}$ would have been canceled by the complementary pixel level fixed pattern noise included in the black signal level $V_{BLK}$; however, the additional KTC noise in the black signal level $V_{BLK}$ would remain as part of the output signal OUT.

FIG. 5B is a series of timing diagrams illustrating the operation for reading out the signal stored on the capacitor C3. Timing diagrams are shown illustrating the operation of the control signals for switches S3 and M6. As illustrated, at time t7, the control signal for switch M6 transitions high. Switch M6 represents a column select switch. When the control signal for switch M6 is transitioned high, switch M6 is closed, thus allowing the signal stored on capacitor C3 to be read out.

At time t8, the control signal for switch S3 transitions high after the signal stored in capacitor C3 has been read out. As illustrated in FIG. 2, the closing of switch S3 causes the capacitor C3 to be reset to the reference voltage level $V_{ref2}$. Similar to the correlated double sampling described above, the signals stored in capacitor C3 and the reference voltage level $V_{ref2}$ form another correlated double sampling sequence. The correlated double sampling of the signals helps to cancel the fixed pattern noise caused by a variation or mismatch in the output buffer 310. At time t9, the control signals for switches S3 and M6 both transition low, thus opening switches S3 and M6.

Figure 6:
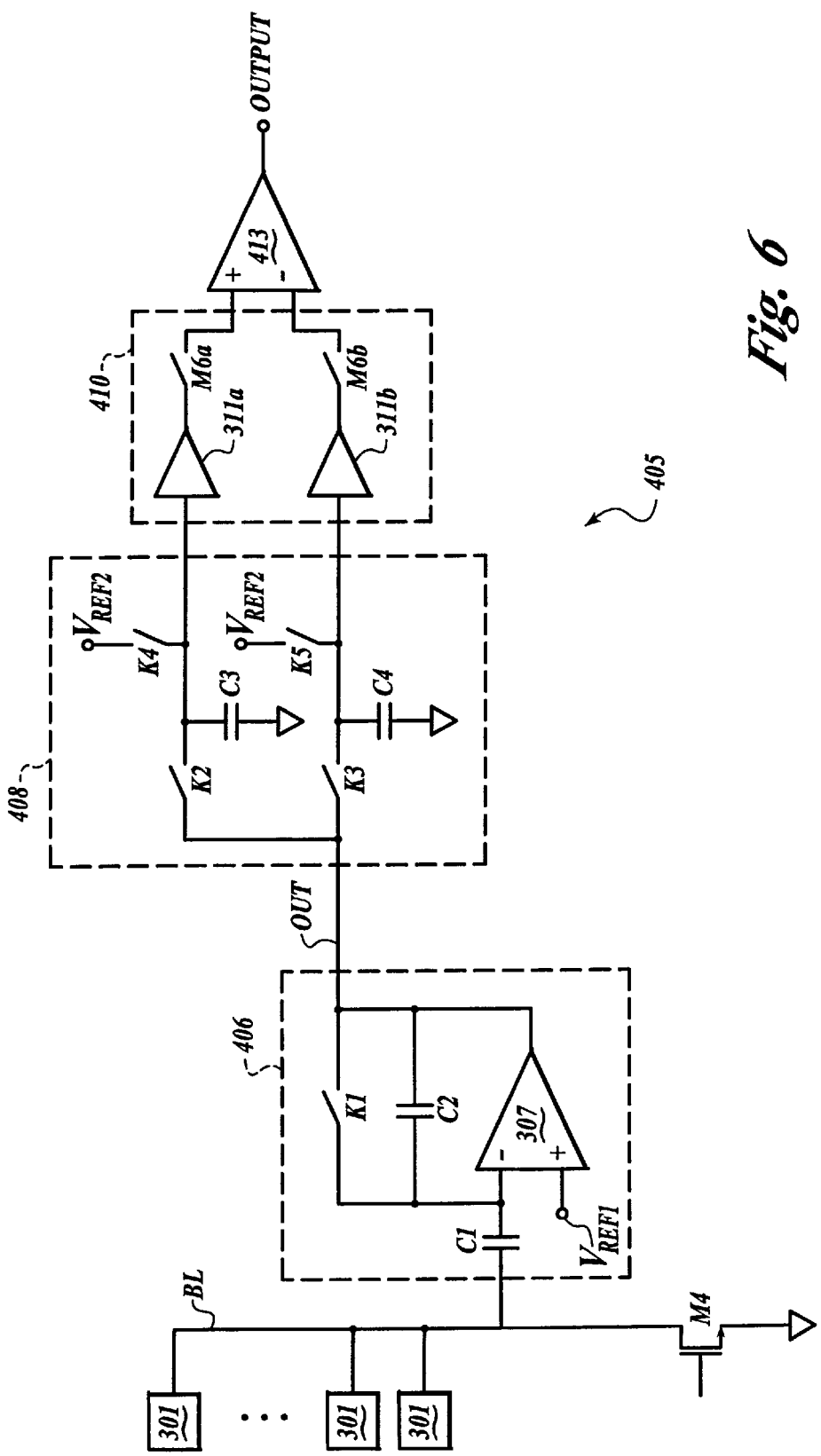
FIG. 6 is a schematic diagram of a differential implementation of a column amplifier formed in accordance with the present invention.

FIG. 6 shows a differential implementation of the column amplifier of the present invention. The differential implementation can cancel the offset of the switching capacitor amplifier and the reset noise of switch K1. The circuit also saves the equalization level in capacitor C3 and the amplified difference of the two states in capacitor C4.

As seen in FIG. 6, each column amplifier 405 of the present invention includes a switching capacitor amplifier 406, a sample and hold stage 408, an output buffer stage 410, and a differential amplifier 413. Many of the components are similar to those of the column amplifier of FIG. 2, and have been given similar designations. More specifically, each column amplifier 405 includes a sense capacitor C1, an operational amplifier 307, a feedback capacitor C2, a first output capacitor C3, a second output capacitor C4, a first output buffer 311a, a second output buffer 311b, a differential amplifier 413, and switches K1, K2, K3, K4, K5, M6a, and M6b. In the preferred embodiment, the capacitors are fabricated as part of a MOS device. As described below, the switches K1–K5, M6a and M6b control the routing of the input signal from the active pixel cell 301 through the column amplifier 405.

The sense capacitor C1 is connected between the bit line BL from the active pixel cell 301 and the inverting input of the operational amplifier 307. The bit line BL is also coupled to ground through a transistor M4. The noninverting input of operational amplifier 307 is connected to a reference voltage $V_{ref1}$. The output of the operational amplifier 307 is fed back into the inverting input of the operational amplifier 307 through the feedback capacitor C2. The switch K1 is coupled between the output of the operational amplifier 307 and the inverting input of the operational amplifier 307.

The output of the operational amplifier 307 is provided via the switch K2 to an input terminal of the first output capacitor C3. The other terminal of the first output capacitor C3 is connected to ground. Also coupled to the input terminal of the first output capacitor C3 via the switch K4 is a second reference voltage $V_{ref2}$. Also connected to the input terminal of the first output capacitor C3 is the input to the first output buffer 311a. The output of the first output buffer 311a is provided via a switch M6a to the noninverting input of a differential amplifier 413.

The output of operational amplifier 307 is also provided via the switch K3 to an input terminal of the second output capacitor C4. The other terminal of the second output capacitor C4 is connected to ground. Also provided to the input terminal of the second output capacitor C4 via the switch K5 is the second reference voltage $V_{ref2}$. In an alternate embodiment, rather than having the switches K4 and K5 couple the capacitors C3 and C4 to the reference voltage $V_{ref2}$, a single switch could instead be used to couple the capacitors C3 and C4 to one another. Also connected to the input terminal of the second output capacitor C4 is the input to the second output buffer 311b. The output of the output buffer 311b is provided via the switch M6b to the inverting input of the differential amplifier 413. Finally, the output of the differential amplifier 413 provides the output signal of the column amplifier 405.

FIG. 7 shows a series of timing diagrams illustrating the operation of the column amplifier 405 of FIG. 6. As illustrated, prior to time t1, all of the control signals and the bit line BL signal are low, while the output signal OUT from the switching capacitor amplifier 406 is unknown and in a "don't care" state. As will be described in more detail below, unlike the timing diagrams illustrated for the operation of FIG. 2 in which only a single active pixel cell 301 was used to obtain the image signal, in the timing diagrams for the operation of FIG. 6, an additional active pixel cell is used for the starting exposure. In other words, in the operation of FIG. 6, in addition to the active pixel cell 301 from which the image signal is to be read, another active pixel cell 301 is precharged for the starting exposure. The precharged active pixel cell 301 has the identical components illustrated in FIG. 3, with the exception that the control signals are designated as RS1 and RST1 in the timing diagrams of FIG. 7.

As illustrated in FIG. 7, at time t1, the control signal RS1 transitions high, thus causing the FET transistor M3 (FIG. 3) of the precharged active pixel cell to be biased on. The control signal RS1 not only selects the active pixel cell that is to be precharged, but also allows the voltage of the bit line BL to increase, as current is able to flow through the FET transistors M2 and M3 of FIG. 3 and the transistor M4 of FIG. 6.

At time t2, the control signal RST1 transitions high, thus biasing on transistor M1 (FIG. 3) of the precharged active pixel cell 301. The biasing on of transistor M1 precharges the active pixel cell 301 to the black signal level $V_{BLK1}$. Also occurring at time t2, the control signal for switch K1 goes high, thus causing switch K1 to close. The closing of switch K1 causes the output of amplifier 307 to approach the reference voltage $V_{ref1}$.

At time t3, the control signal RST1 transitions low, thus biasing off transistor M1 of the precharged active pixel cell 301. The biasing off of transistor M1 ends the precharge operation. Following time t3, the voltage level in the bit line decreases to the signal level $V_{CHG1}$ because of a decrease in the voltage in the active pixel cell 301. The voltage in the active pixel cell 301 decreases due to the charge injection of the transistor M1. The output signal OUT of amplifier 307 remains at the reference voltage $V_{ref1}$. The opening of transistor M1 introduces KTC noise into the signal from the active pixel cell 301. This KTC noise affects the signal from the active pixel cell 301 when the image signal is read out after the integration period ends. As will be described in more detail below, steps are taken to prevent this KTC noise from appearing in the image signal to be read at times t5 and t11.

At time t4, the control signal for switch K1 transitions low, thus causing switch K1 to open. The precharged level from the precharged active pixel cell 301 is thus stored on capacitor C1. The precharged level $V_{CHG1}$ represents the reset level including the charge injection. The opening of switch K1 introduces KTC noise, although, as will be described in more detail below, this KTC noise can be canceled through double sampling.

At time t5, the control signal RS 1 transitions low, thus biasing off the transistor M3 of the precharged active pixel cell 301. Also occurring at time t5, the control signal RS transitions high, thus biasing on transistor M3 of the active pixel cell 301 from which the image signal is to be read. Thus, the transitioning of the control signal RS1 to low deselects the precharged active pixel cell 301, while the transitioning of the control signal RS to high selects the active pixel cell 301 from which the image signal is to be read out. The voltage on the bit line BL decreases to the signal level $V_{IMG2}$ because the charge in the image signal active pixel cell 301 is lower. The voltage change in the bit line BL is amplified by switching capacitor amplifier 406 to produce a signal level $V_{C3}$.

At time t6, the control signal for switch K2 transitions high, thus causing switch K2 to close. The closing of switch K2 causes the amplified image signal at the output of the switching capacitor amplifier 406 to charge the capacitor C3 to the output signal level $V_{C3}$.

At time t7, the control signal for the switch K2 transitions low, thus causing the switch K2 to open. The opening of the switch K2 causes the amplified image signal to be stored on the capacitor C3. The opening of switch K2 also introduces KTC noise that is also stored on the capacitor C3. This KTC noise cannot be canceled. However, because the image signal has already been amplified by the switching capacitor amplifier 406, the proportional level of the KTC noise introduced by the switch K2 is proportionally lower than it would be if the image signal had not been so amplified. Thus, the overall signal-to-noise ratio is improved. As will be described in more detail below, the image signal stored on the capacitor C3 includes all the mismatching and KTC noise that occur up until time t7, which are later used to cancel similar noise levels.

At time t8, the control signal RST transitions high, thus biasing on the transistor M1 of the image signal active pixel cell 301. The biasing on of transistor M1 starts the reset of the image signal saved in the active pixel cell 301. The resetting of the active pixel cell 301 causes an increase in the voltage in the active pixel cell 301. The increase in the voltage of the active pixel cell 301 causes an increase in the voltage on the bit line BL to the black signal level $V_{BLK2}$. The increase in the voltage on the bit line BL to the black signal level $V_{BLK2}$ causes a corresponding decrease in the output level of the switching capacitor amplifier 406 to the signal level $V_{RST2}$. Also occurring at time t8, the control signal for switch K3 transitions high, thus causing the switch K3 to close. The closing of switch K3 causes the capacitor C4 to be charged to the level of the output voltage of a switching capacitor amplifier 406.

At time t9, the control signal RST transitions low, thus biasing off the transistor M1 of the image signal active pixel cell 301. The biasing off of transistor M1 ends the reset process for the image signal active pixel cell 301. The voltage level in the image signal active pixel cell 301 drops due to the charge injection of the transistor M1 and causes a corresponding decrease in the voltage on the bit line BL to the signal level $V_{CHG2}$. This voltage decrease causes an amplified increase in the output signal OUT of the amplifier 307 to the signal level $V_{C4}$. In the ideal case, the output signal level $V_{C4}$ of amplifier 307 is the same as reference voltage level $V_{ref1}$ because the voltage on the bit line BL should return to the level it was at times t4 and t5. The biasing off of FET transistor M1 introduces KTC noise into the signals on the capacitor C4. As was described above with reference to the timing diagrams of FIG. 5A, the timing of the switches can be such that both the KTC random noise and the pixel level fixed pattern noise introduced by charge injection are stored on the capacitor, or else the signal may be stored prior to the introduction of these noise signals. The tradeoffs between these two types of timing schemes are discussed above.

At time t10, the control signal for switch K3 transitions low, thus opening the switch K3. The output voltage level $V_{C4}$ of the switching capacitor amplifier 406 is thus stored on the capacitor C4. The opening of switch K3 introduces KTC noise that is included in the voltage level stored on the capacitor C4. Similar to the KTC noise that occurred at time t7, this KTC noise cannot be canceled. As described above, the voltage level at time t10 that is stored on the capacitor C4 was derived from a continuous process of adding and subtracting signals from the original signal. Thus, the voltage level stored on capacitor C4 includes all of the same noise elements that occurred up until time t7, as are also stored on capacitor C3. Therefore, the amplified differential between the signals stored on the capacitors C3 and C4 cancels the KTC random noise introduced at time periods t1 and t5, in addition to canceling the fixed pattern noise caused by mismatching in the active pixel cells 301, the bit line BL, and the switching capacitor amplifier 406.

At time t11, the control signal RS transitions low, thus causing FET transistor M3 of the image signal active pixel cell 301 to be biased off. The biasing off of FET transistor M3 causes the voltage on the bit line BL to drop to the ground level since no current is otherwise being provided.

Switches K4, K5, M6a, and M6b are used to read out the signals stored on the capacitors C3 and C4. The operation of switches K4, K5, M6a and M6b is similar to the operation of switches S3 and M6 as described with respect to the timing diagrams of FIG. 5B.

As described above, the column amplifier of the present invention illustrated in FIGS. 2 and 6 is capacitively coupled by a capacitor C1 to the bit line BL. The switching capacitor amplifier 307 is able to cancel the common mode offset in the bit line. This improves the fixed pattern noise reduction. In addition, the common mode offset can be adjusted in the switching capacitor amplifier 307. This allows the buffer stages 311 to not be limited by the common mode level of the active pixel cells 301. In addition, the gain of a switching capacitor amplifier, as represented by the ratio of the capacitor C2 over the capacitor C1, amplifies the pixel signals to improve further signal processing. In other words, noise introduced at later stages of the signal processing will comprise a lower proportion of the total signal once the signal has been amplified.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A column amplifier for use in an image sensor, said image sensor including a plurality of pixels organized into rows and columns, at least one of said columns having the signals from its pixels being carried by a bit line for further signal processing, said column amplifier comprising:
    (a) a signal amplifier for amplifying signals from the bit line, the signal amplifier including at least one input and at least one output;
    (b) an input capacitor capacitively coupling an input of the signal amplifier to the bit line;
    (c) a feedback capacitor coupled directly in a feedback path between an input of the signal amplifier and an output of the signal amplifier; and
    (d) a switch between said input of the signal amplifier and said output of the signal amplifier, said switch being in parallel with said feedback capacitor to selectively bypass said feedback capacitor;
    wherein no other electrically active element other than said feedback capacitor is in said feedback path.

2. The column amplifier of claim 1, further comprising a sample and hold stage coupled to an output of the signal amplifier and having an input and an output.

3. The column amplifier of claim 2, further comprising a buffer stage coupled to the output of the sample and hold stage.

4. The column amplifier of claim 3, wherein the sample and hold stage includes at least two sampling capacitors and the buffer stage includes at least two buffers, the buffers each having an input and an output.

5. The column amplifier of claim 4, further comprising a differential amplifier for amplifying the difference between the outputs of the two buffers of the buffer stage.

6. A column amplifier for use in an image sensor, said image sensor including a plurality of pixels organized into rows and columns, at least one of said columns having the signals from its pixels carried by a bit line for further signal processing, said column amplifier comprising:
    (a) an operational amplifier with an inverting input, a noninverting input, and an output;
    (b) an input capacitor coupled between the bit line and one of the inputs of the operational amplifier;
    (c) a feedback capacitor coupled directly in a feedback path between one of the inputs of the operational amplifier and the output of the operational amplifier; and
    (d) a switch between said input of the signal amplifier and said output of the signal amplifier, said switch being in parallel with said feedback capacitor to selectively bypass said feedback capacitor;
    wherein no other electrically active element other than said feedback capacitor is in said feedback path.

7. The column amplifier of claim 6, further comprising a sample and hold stage coupled to the output of the operational amplifier, the sample and hold stage having at least one input and at least one output.

8. The column amplifier of claim 7, further comprising a buffer stage coupled to an output of the sample and hold stage.

9. The column amplifier of claim 8, wherein the sample and hold stage includes at least two signal lines with at least one sampling capacitor coupled to each of the two signal lines.

10. The column amplifier of claim 9, wherein the buffer stage includes at least two signal lines with at least one output buffer coupled to each of the two signal lines.

11. A method for amplifying signals from a bit line from a column of an image sensor, the method comprising:
    (a) adjusting the common mode offset in the image signals from the bit line to produce adjusted image signals; and
    (b) amplifying the adjusted image signals to produce amplified adjusted image signals.

12. The method of claim 11, further comprising further processing the amplified image signals through a sample and hold stage.

13. The method of claim 12, wherein the processing of the amplified adjusted image signals through the sample and hold stage includes storing a signal voltage level on a first capacitor and reference voltage level on a second capacitor.

14. The method of claim 13, further comprising further processing the amplified adjusted image signals through a buffer stage.

15. The method of claim 14, further comprising amplifying the difference between the signal voltage level and the reference voltage level after the buffer stage.

16. The method of claim 11, wherein the adjustment of the common mode offset is accomplished through use of a switching capacitor amplifier in which the common mode offset may be adjusted.

* * * * *